United States Patent
Dhani Reddy et al.

(10) Patent No.: US 9,911,474 B1
(45) Date of Patent: Mar. 6, 2018

(54) FEEDBACK CIRCUIT AT WORD LINE ENDS

(71) Applicant: GLOBALFOUNDRIES INC., Grand Cayman (KY)

(72) Inventors: Sreenivasula Reddy Dhani Reddy, Bangalore (IN); Arjun Sankar, Bangalore (IN); Sushma Nirmala Sambatur, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/451,470

(22) Filed: Mar. 7, 2017

(51) Int. Cl.
G11C 7/00 (2006.01)
G11C 7/12 (2006.01)
G11C 8/10 (2006.01)
G11C 7/10 (2006.01)

(52) U.S. Cl.
CPC .............. G11C 7/12 (2013.01); G11C 7/10 (2013.01); G11C 8/10 (2013.01)

(58) Field of Classification Search
CPC .............. G11C 7/12; G11C 8/10; G11C 7/10
USPC ........................................ 365/191, 203, 206
See application file for complete search history.

(56) References Cited

U.S. PATENT DOCUMENTS

| | | | |
|---|---|---|---|
| 5,973,992 A * | 10/1999 | Casper ................. | G11C 7/14 365/230.06 |
| 6,144,610 A | 11/2000 | Zheng et al. | |
| 6,791,897 B2 * | 9/2004 | Choi ...................... | G11C 8/08 365/189.11 |
| 7,372,321 B2 | 5/2008 | Krishna et al. | |
| 7,848,174 B2 * | 12/2010 | Cheng ................. | G11C 11/413 365/189.09 |
| 7,940,545 B2 * | 5/2011 | Sharma ................. | G11C 17/12 365/203 |
| 8,223,572 B2 | 7/2012 | Jain et al. | |
| 8,411,509 B2 * | 4/2013 | Lee ....................... | G11C 8/08 365/185.13 |
| 8,730,750 B1 * | 5/2014 | Trivedi ................. | G11C 7/08 365/210.1 |
| 9,208,859 B1 | 12/2015 | Bringivijayaraghavan et al. | |
| 9,236,128 B1 * | 1/2016 | Louie ................. | H01L 27/1157 |
| 9,336,862 B2 * | 5/2016 | Won ...................... | G11C 11/419 |
| 9,496,025 B2 | 11/2016 | Chandra et al. | |
| 2003/0214847 A1 | 11/2003 | Brucke | |
| 2009/0116293 A1 | 5/2009 | Lee et al. | |
| 2011/0085399 A1 * | 4/2011 | Chen ..................... | G11C 8/08 365/226 |

(Continued)

*Primary Examiner* — Viet Q Nguyen
(74) *Attorney, Agent, or Firm* — Gibbs & Riley, LLC; Anthony J. Canale

(57) ABSTRACT

Devices include an array of memory cells arranged in rows and columns. Wordlines are connected to the memory cells, and each of the wordlines is connected to a distinct row of the array of the memory cells. A wordline driver circuit is connected to a near end of the wordlines. The wordline driver circuit outputs a wordline select signal. Also, a feedback circuit is connected to a far end of each of the wordlines, opposite the near end of the wordlines. The feedback circuit includes first transistors (gated by the internal clock signal and the wordline select signal) electrically connecting a relatively lower voltage source to the far end of the wordlines; and second transistors (also gated by the internal clock signal and the wordline select signal) electrically connecting a relatively higher voltage source to the far end of the wordlines.

13 Claims, 7 Drawing Sheets

(56) References Cited

U.S. PATENT DOCUMENTS

2012/0008438 A1* 1/2012 Jain .................... G11C 7/22
                                                    365/194
2013/0329505 A1   12/2013 Yang et al.

* cited by examiner

FEEDBACK CIRCUIT AT WORD LINE ENDS

BACKGROUND

Field of the Invention

The present disclosure relates to structures within memory arrays, and more specifically, to structures that increase the speed at which the wordlines within such arrays are charged or discharged.

Description of Related Art

Electronic memories that store data based on charge or resistance (e.g., static random access memory (SRAM); dynamic random access memory (DRAM), etc.) use memory cells arranged in arrays having rows (wordlines) and columns (bitlines). Such cells are selected by only one of the wordlines having a charge, and one or more bitlines providing or sensing a charge. For the charged wordline (e.g., higher voltage) all the control gates of the cells in the row connected to the charged wordline are turned on. The selected bitline(s) connect the storage nodes of every memory cell in a column to a sense amplifier and a write-driver. In such devices, only one of the wordlines will be pulled-up to the higher voltage (e.g., VDD), while all the other wordlines must be pulled-down to a lower voltage (e.g., VSS or GND).

The foregoing operates well; however, the time for the wordline to charge and discharge can decrease the performance of the memory array. For example, the wordlines may be relatively long as word width becomes larger and larger, and the wordline select signal takes time to travel from the near end that is connected to the decoder to the far end (distal end) that is at the furthest point away from the decoder. Delays caused by resistance and capacitance (RC delays) result in performance limitations and reliability problems. This is amplified because reduction in wordline width increases the wordline resistance, especially relative to the decoder's drive transistor channel resistance. This higher resistance ratio increases wordline slew time, effective reducing wordline pulse width, and this impacts the read/write margin, and can result in malfunctions.

SUMMARY

Exemplary devices herein include an array of memory cells arranged in rows and columns that are perpendicular to each other. Wordlines (conductors) are connected to the memory cells, and each of the wordlines is connected to a distinct row of the array of the memory cells. A wordline driver circuit is connected to a near end of the wordlines. The wordline driver circuit outputs a wordline select signal. Also, a feedback circuit is connected to a far end of each of the wordlines, opposite to the near end of the wordlines. The feedback circuit includes first transistors (gated by the internal clock signal and the wordline select signal) electrically connecting a relatively lower voltage source to the far end of the wordlines; and second transistors (also gated by the internal clock signal and the wordline select signal) electrically connecting a relatively higher voltage source to the far end of the wordlines.

In other more specific electronic storage devices herein, the array of memory cells are arranged in rows and columns that are perpendicular to each other, and the wordlines (that are conductors) are connected to the memory cells, such that each different wordline is connected to a distinct row of the array of the memory cells. The length of the wordlines between the near end and the far end equals a full length of the rows of the memory cell.

Further, bitlines (conductors) are also connected to the memory cells, and each of the bitlines is similarly connected to a distinct column of the array of the memory cells. A wordline driver circuit is connected to a near end of the wordlines. The wordline driver circuit includes a decoder outputting a wordline select signal in response to the internal clock signal.

A feedback circuit is connected to a far end of each of the wordlines (opposite the near end of the wordlines. The wordlines are uninterrupted conductors from the near end to the far end, so for arrays that are interrupted by additional drivers or redrivers, a column of feedback circuits is included at the end of the wordlines where the drivers or redrivers interrupt the wordlines.

The feedback circuit includes an inverter connected to the far end of the wordlines, an inner positive polarity transistor (gated by output from the inverter) electrically connecting the inverter back to the far end of the wordlines (to form a first feedback loop), and an outer positive polarity transistor (also gated by the internal clock signal) electrically connecting a relatively lower voltage source to the inner positive polarity transistor. For example, the relatively lower voltage source can be a pull-down circuit. The feedback circuit also corresponding includes an inner negative polarity transistor (gated by output from the inverter) electrically connecting the inverter back to the far end of the wordlines (to form a second feedback loop), and an outer negative polarity transistor (gated by the internal clock signal) electrically connecting a relatively higher voltage source to the inner negative polarity transistor. For example, the relatively higher voltage source can be a pull-up circuit.

The inner positive polarity transistor electrically disconnects the relatively lower voltage source from the first feedback loop when the wordline select signal is present, and the inner negative polarity transistor electrically disconnects the relatively higher voltage source from the second feedback loop when the wordline select signal is not present. Therefore, in operation, the first feedback loop lowers the voltage of the far end of the wordlines that do not have the wordline select signal by connecting the far end of the wordlines to the relatively lower voltage source when the wordline signal select is not present. In contrast, the second feedback loop raises the voltage of the far end of the wordline that has the wordline select signal by supplying voltage from the relatively higher voltage source when the wordline select signal is present.

Additionally, the internal clock signal arrives to the outer positive polarity transistor and the outer negative polarity transistor before the wordline select signal arrives at the far end of the wordlines. Therefore, the internal clock signal controls the outer positive polarity transistor and the outer negative polarity transistor before the wordline select signal controls the inner positive polarity transistor and the inner negative polarity transistor, thereby preventing the pull-up or pull-down circuits from fighting with the wordline select signal.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, electronic memory arrays with longer and more narrow wordlines increasingly suffer from excessive RC delay, which can undesirably increase the resistance ratio (e.g., the ratio of the wordline resistance to that of the channel of the drive transistor). This, in turn, increases wordline slew time, reduces effective wordline pulse width, and impacts the read/write margin. The devices herein address these issues by pulling-up or pulling-down the wordlines from the near end and the far end simultaneously. The devices disclosed herein gate off (disconnect) the higher or lower voltage from the far end of the wordline using outer transistors that receive an internal clock signal (the internal clock signal is received before the wordline select signal would be received). In this way, by protecting the far end of the wordlines, and providing such protection before the wordline select signal is received by the far end of the wordline, the devices herein allow the inner transistors that are supplying the pull-up or pull-down voltage to the far end of the wordline to operate without negative influence of the opposing pull-up or pull-down voltage connections.

Figure 1:
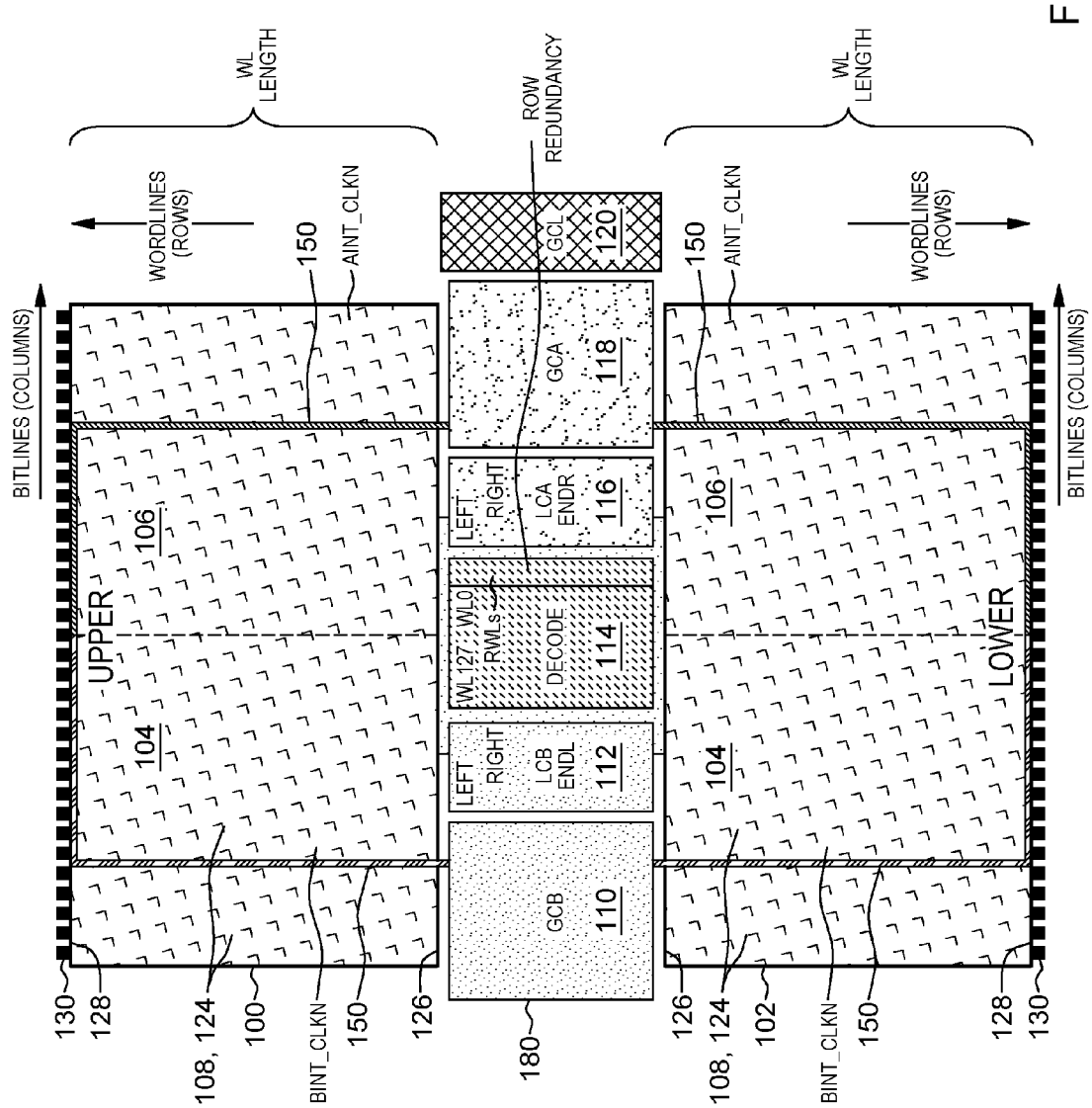
FIG. 1 is a schematic diagram illustrating a memory array herein.
Figure 2:
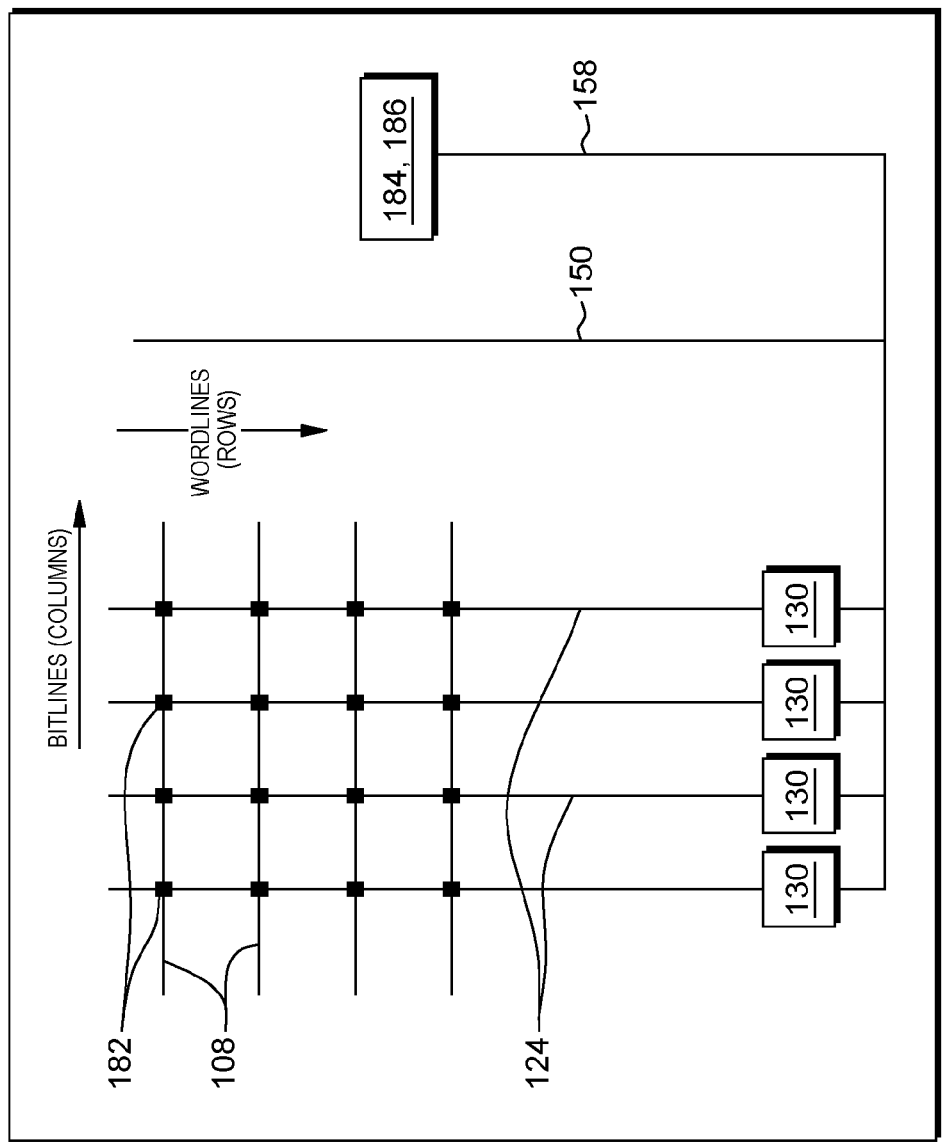
FIGS. 2 and 3 are schematic diagrams illustrating different portions of the memory array shown in FIG. 1.

FIG. 1 illustrates an electronic storage device (e.g., memory array) having an array 100, 102 of memory cells. FIG. 2 illustrates a portion of the memory array shown in FIG. 1, and shows that the memory cells are arranged in rows and columns. As shown in FIGS. 1 and 2, the wordlines 124 (that are conductors) are connected to the memory cells 182, such that each different wordline is connected to a distinct row of the array 100, 102 of the memory cells 182 and each different bitline, or pair or bitlines (both represented by item 108 in the drawings), is connected to a distinct column of the array 100, 102.

FIGS. 1 and 2 therefore illustrate an array of memory cells 182 arranged in rows and columns that are perpendicular to each other. In this example, the array includes an upper array 100 and a lower array 102, each of which includes a "B" bank 104 and an "A" bank 106 (although those ordinarily skilled in the art would understand that the memory array could be in a single, unbroken structure, or that additional divisions of the array could be utilized).

A control/wordline driver circuit structure 180 is positioned between the upper array 100 and the lower array 102. The control/wordline driver circuit structure 180 includes global control circuitry for the "B" banks (GCB) 110 and the "A" banks (GCA) 118 outputting an internal clock signal 150, logic controller for the "B" banks (LCBENDL) 112 and the "A" banks (LCAENDR) 116, a wordline driver circuit (DECODE) 114 outputting a wordline select signal in response to the internal clock signal 150, and global control logic circuitry (GCL) 120.

The length of the wordlines 124 between the near end 126 and the far end 128 is equal to the full length of the rows of the memory cell in each of the upper (100) and lower (102) sections of the array. The wordline driver circuit 180 is connected to a "near end" 126 of the wordlines 124, which is the bottom of the wordlines 124 in the upper portion of the array 100 and the top of the wordlines 124 in the lower portion of the array 102. The "far end" 128 of the wordlines 124 is distal to (meaning at the furthest point away from) the driver circuit structure 180. In other words, the near end 126 is at one end of the wordlines 124 (the end that contacts the driver circuit 114) and the far end 128 is at the opposite end of the wordlines 124 (that is furthest away from the driver circuit 114).

A feedback circuit 130 is connected to the far end 128 of each of the wordlines 124 (opposite the near end 126 of the wordlines 124). The feedback circuit 130 is shown in greater detail in FIG. 3, and includes an inverter 144 connected to the far end 128 of the wordlines 124. Because a separate feedback circuit 130 is connected to each of the wordlines 124, a different inverter 144 is connected to each different wordline 124.

Figure 3:
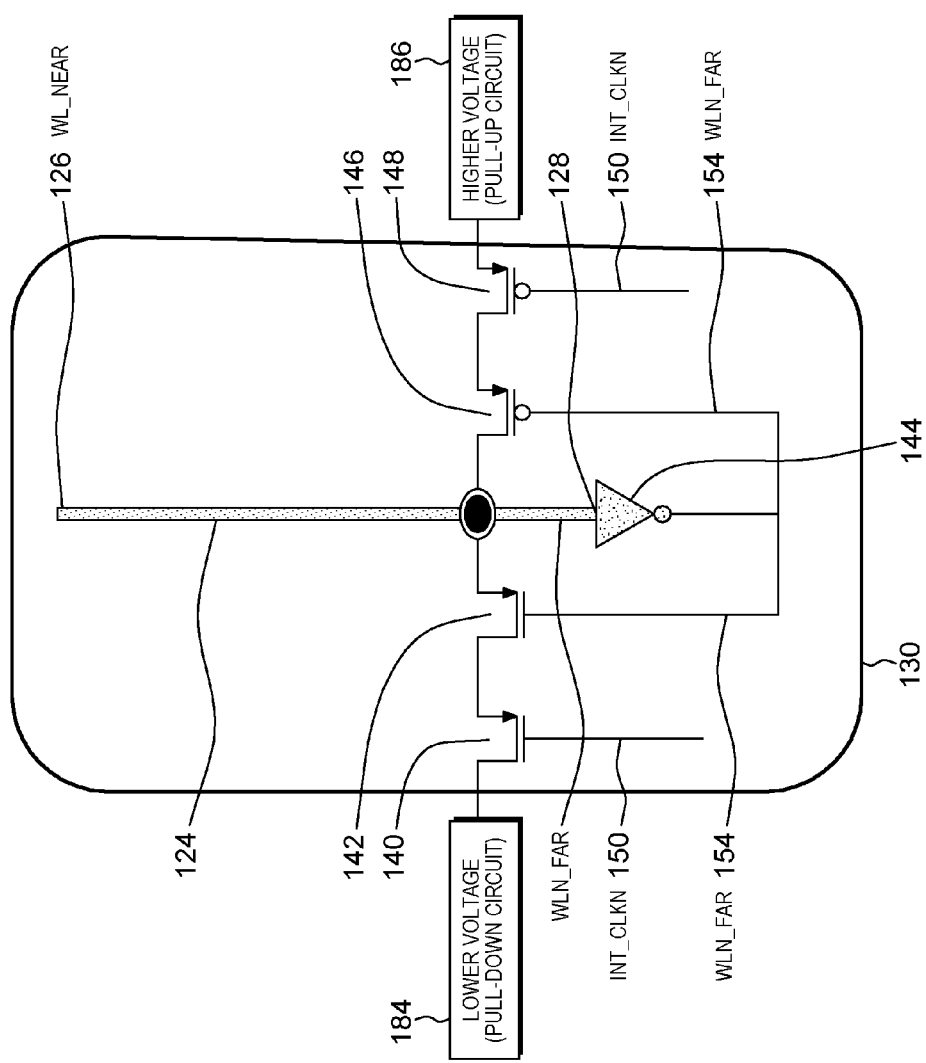

As shown in FIG. 3, an inner positive polarity transistor 142 (gated by the output from the inverter 144) electrically connects the inverter 144 back to the far end 128 of the wordlines 124 (to form a first feedback loop). Also, an outer positive polarity transistor 140 (gated by the internal clock signal 150) electrically connects a relatively lower voltage source 184 to the inner positive polarity transistor 142. For example, the relatively lower voltage source 184 can be a pull-down circuit that drives the wordlines 124 to a lower voltage (VSS or GND).

The feedback circuit 130 corresponding includes an inner negative polarity transistor 146 (gated by output from the inverter 144) electrically connecting the inverter 144 back to the far end 128 of the wordlines 124 (to form a second feedback loop), and an outer negative polarity transistor 148 (gated by the internal clock signal 150) electrically connecting a relatively higher voltage source 186 to the inner negative polarity transistor 146. For example, the relatively higher voltage source 186 can be a pull-up circuit drives the wordlines 124 to a higher voltage (VSS or VDD).

Note that in the following example, "selected" or "active" signals are discussed as being relatively higher voltage signals (opposite the relatively lower voltage signals); the transistors described as being positive polarity transistors are made conductive (are turned on) by such a relatively higher voltage signals (and are otherwise off (non-conductive)), and the transistors described as being negative polarity transistors are turned on (made conductive) by such relatively lower voltage signals (and are otherwise off (non-conductive)). However, those ordinarily skilled in the art would understand that such distinctions are relative, and all signals and voltages and transistor types could be reversed to achieve the same effect. Therefore, the relatively high and low voltage signals herein, and the operation of the positive and negative transistors are used as but an example, and the claims presented below are not intended to be limited to this specific example, but instead are applicable to all devices that have a similar structure.

More specifically, in a wordline pull-up operation, when the wordline select signal is present (high signal) at the far end 128 of the wordline 124, the inverter 144 outputs a low signal, which turns off the inner positive polarity transistor 142, but turns on the inner negative polarity transistor 146. This electrically disconnects the relatively lower voltage source 184 from the first feedback loop, but electrically connects the relatively higher voltage source 186 to the second feedback loop. This causes the second feedback loop to raises the voltage of the far end 128 of the wordline that receives the wordline select signal by supplying the relatively higher voltage from the relatively higher voltage source 186 (subject to the fact that internal clock signal 150 has already turned ON outer negative polarity transistor 148).

In contrast, in a wordline pull-down operation, when the wordline select signal is not present (low signal) at the far end 128 of the wordline 124, the inverter 144 outputs a high signal, which turns on the inner positive polarity transistor 142, but turns off the inner negative polarity transistor 146. This electrically connects the relatively lower voltage source 184 to the first feedback loop, but electrically disconnects the relatively higher voltage source 186 to the second feedback loop. This causes the first feedback loop to lower the voltage of the far end 128 of the wordlines 124 that do not receive the wordline select signal by connecting the far end 128 of the wordlines 124 to the relatively lower voltage source 184 (subject to the fact that internal clock signal 150 has already turned OFF outer positive polarity transistor 140).

In addition, the internal clock signal 150 arrives to the outer positive polarity transistor 140 and the outer negative polarity transistor 148 before the wordline select signal arrives at the far end 128 of the wordlines 124. Therefore, the internal clock signal 150 controls the connectivity of the outer positive polarity transistor 140 and the outer negative polarity transistor 148 before the wordline select signal controls the inner positive polarity transistor 142 and the inner negative polarity transistor 146, thereby preventing the pull-up or pull-down circuits 184, 186 from fighting with the wordline select signal.

Therefore, as shown above, the devices herein simultaneously pull-up and pull-down the wordlines 124 from the near end 126 (using the decoder 114) and the far end 128 (using the feedback circuit 130). The feedback circuit 130 gates off (disconnects) the higher (186) or lower (184) voltage from the far end 128 of the wordlines 124 using outer transistors 140, 148 that receive an internal clock signal before the wordline select signal would be received. In this way, by protecting the far end 128 of the wordlines 124, and providing such protection before the wordline select signal is received by the far end 128 of the wordline 124, the feedback circuit 130 allows the inner transistors 142, 146 that are supplying the pull-up (186) or pull-down (184) voltage to the far end 128 of the wordline 124 to operate without negative influence of the opposing pull-up (186) or pull-down (184) voltage connections.

Figure 4:
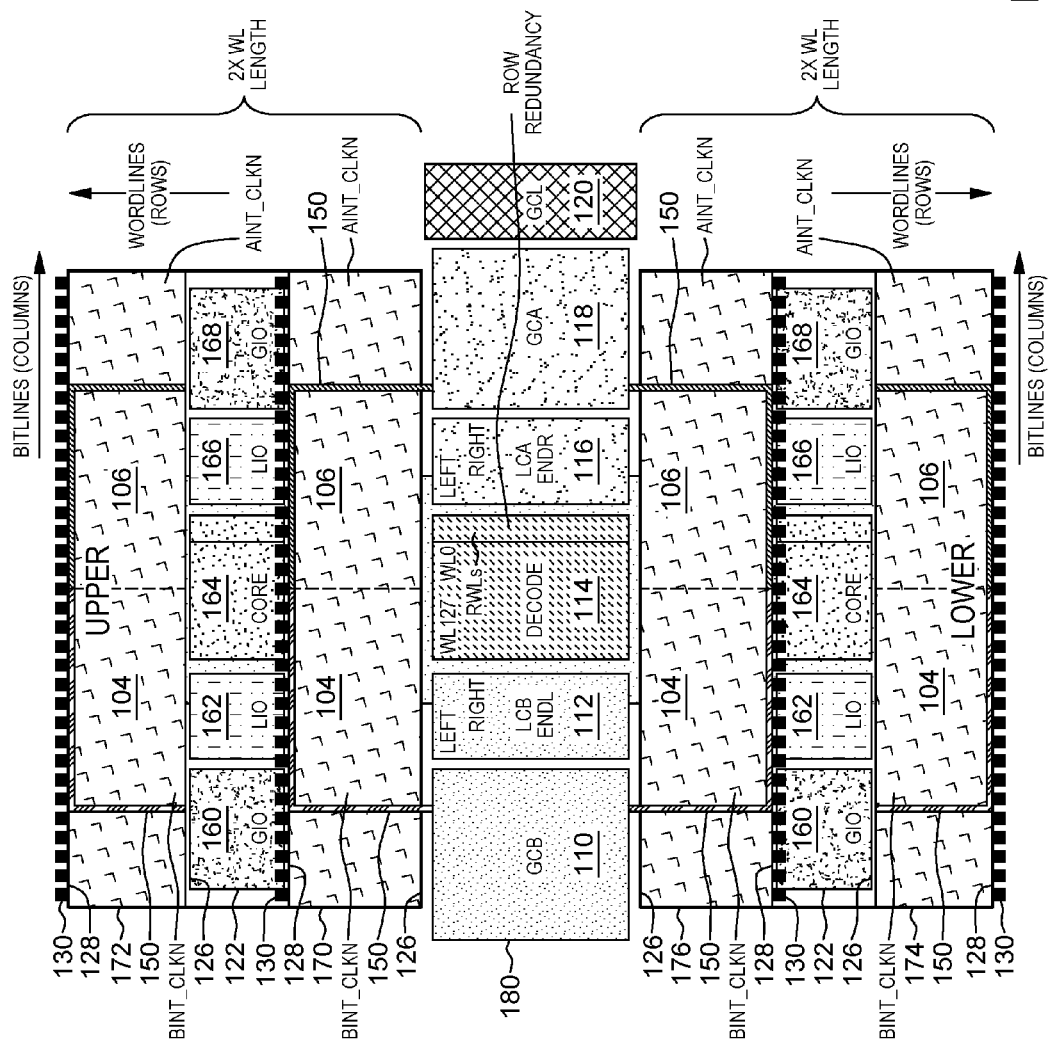
FIG. 4 is a schematic diagram illustrating a memory array herein.

The wordlines 124 are uninterrupted conductors from the near end 126 to the far end 128. Therefore, as shown in FIG. 4, if arrays 100, 102 are interrupted by additional drivers or redrivers 122, a column of feedback circuits 130 is included at the end of the wordlines 124 where the drivers or redrivers 122 interrupt the wordlines 124. For example, such drivers or redrivers can include global input/output circuits (GIO) 160, 168 for the "B" bank 104 and "A" bank 106; local input/output circuits (LIO) 162, 166 for the "B" bank 104 and "A" bank 106; and a logic core 164.

Figure 5:
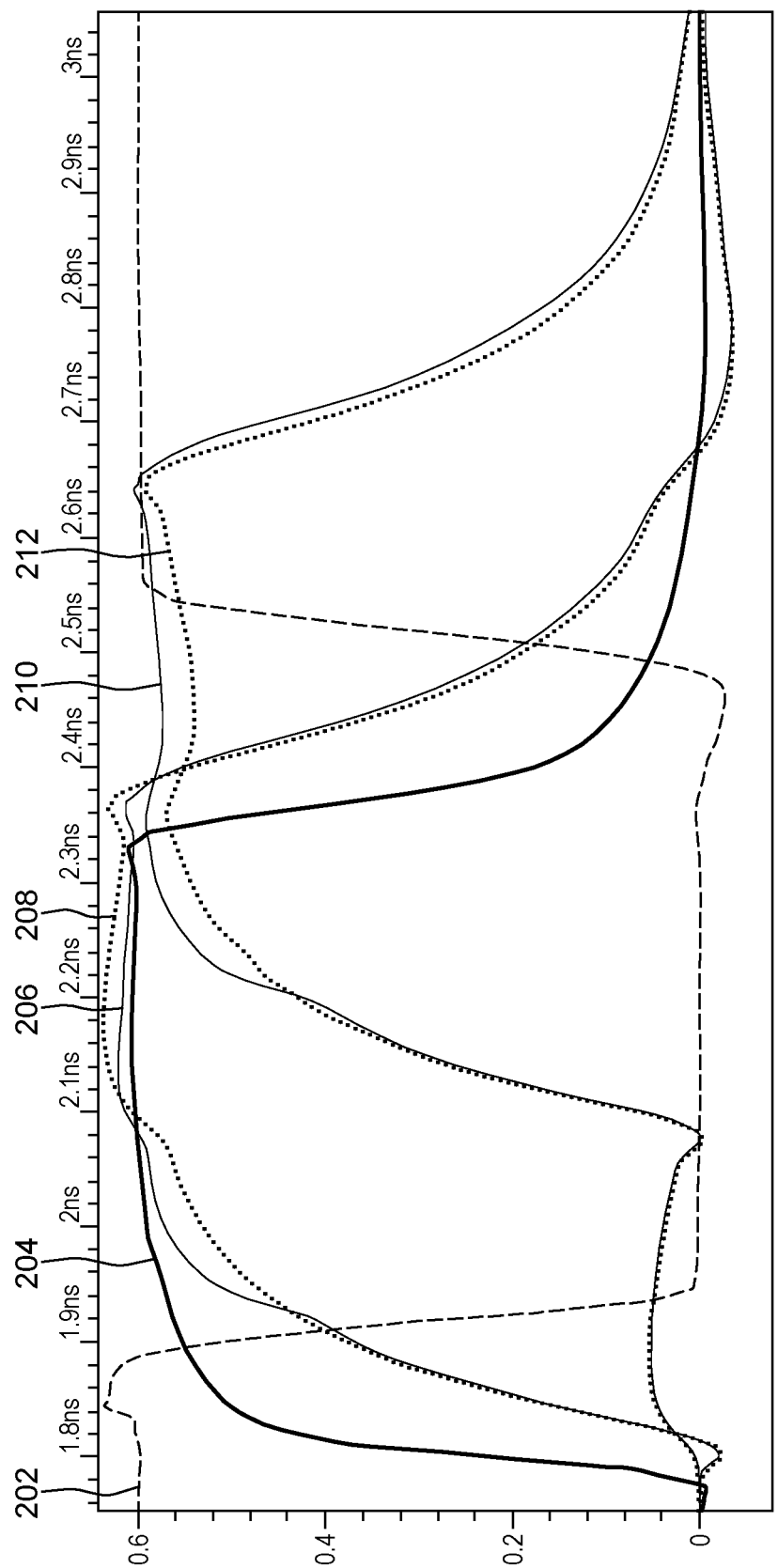
FIG. 5 is a signal timing diagram illustrating operations of devices herein.

FIG. 5 shows an example set of waveforms depicting the working of the circuit. Signal 204 shows the near end of wordline 124, equivalent to 126 in FIGS. 1 and 2. Signals 204 and 206 show the two cases of far end of wordline 124 for comparison, equivalent to 128 in FIGS. 1 and 2. Signal 208 shows the case where this architecture is not implemented and 206 shows the effect of implementation of this architecture. Signal 202 shows the output of inverter 144 in the feedback circuit 130. Signal 204 clearly shows an improvement in the slew compared to 208, as provided by the devices herein.

Figure 6:
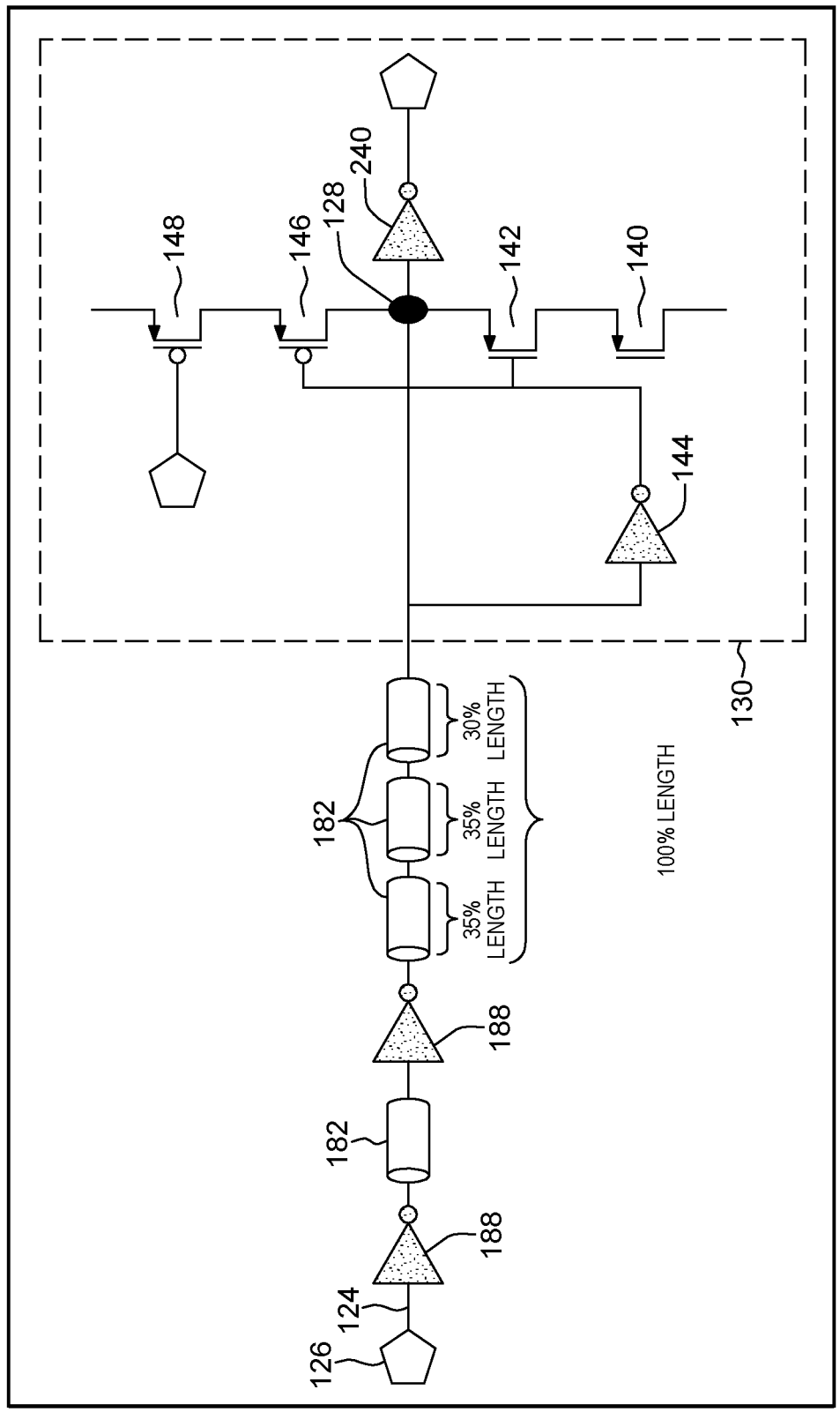
FIG. 6 is a schematic diagram illustrating a portion of a memory array herein.

FIG. 6 illustrates another example of the feedback circuit 130 at the far end 128 of a wordline 124. In FIG. 6, additional inverters 188 are connected to the wordline 124 and the wordline 124 is located after the second inverter 188. Item 182 shows the breakup of the wordline 124 RC length in terms of percentage length. FIG. 6, breaks the RC length into 3 RC networks to show the waveforms after each RC network. Item 130 is a similar feedback circuit to that explained above, and uses the same number to represent the same items. Here, items 148 and 140 are transistor gates connected to the INT_CLK signal. The inverter 240 is just shown as the load on the wordline 124 at the far end. Waveforms of the respective design are shown in FIG. 7.

Figure 7:
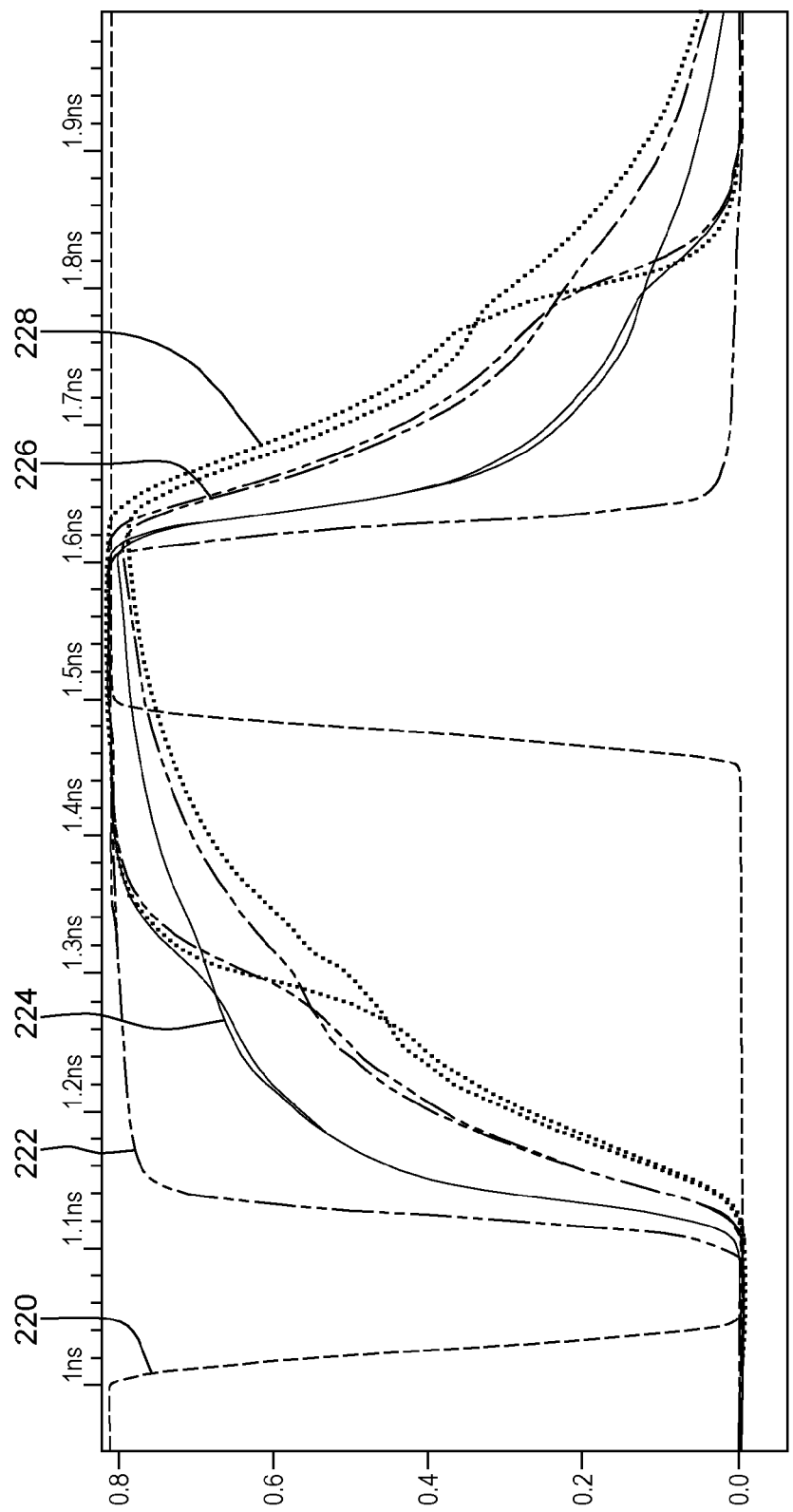
FIG. 7 is a signal timing diagram illustrating operations of devices herein.

More specifically, in FIG. 7, item 220 is the INT_CLK signal equivalent and item 222 is the wordline waveform at the near end i.e., after the second inverter of item 188. The waveform 224 is after the first RC, which is 35% of RC length. Item 226 is the waveform after the second RC, which is after 70% of RC length. Item 228 is the waveform after the last RC, which is after 100% RC length. FIG. 7 overlaps the signals from a design without the feedback circuit, along with signals seeing improved slopes after adding the feedback circuit. Clearly, from the waveforms in FIG. 7, it is visible that after adding the feedback circuit at the far end of wordline, the devices and methods herein provide improved slopes even at the previous RC stages. Thus, the methods and devices herein, produce improvement in slew of far end wordline for both rising and falling edge.

The devices herein provide a circuit that is self-tracking, as the clock signal (INT_CLK) is the same signal that generates the wordline. Meanwhile, the same wordline signal at far end is used to improve slew. This tracks well within multiple core designs. Further, INT_CLK signal loading can be reduced by adding small re-buffer inside each wordline row. The devices herein can improve the slew on the wordline on either edge without breaking a core, and without adding any extra edge cells. These devices can be extended into other similar design ideas, and to any other long RC routes by adding a feedback circuit at the far end of the RC network. The devices herein can also use any equivalent clock signals that can gate the feedback. This design does not require adding any additional delay chains in the wordline path, unlike in mid-driver design, which adds two extra inverters in the wordline path to get to final wordline.

The circuits shown above are included in integrated circuit chips that can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   an array of memory cells arranged in rows and columns that are perpendicular to each other;
   wordlines comprising conductors connected to the memory cells, each of the wordlines is connected to a distinct row of the array of the memory cells;
   a wordline driver circuit connected to a near end of the wordlines, the wordline driver circuit outputs an internal clock signal and a wordline select signal; and
   a feedback circuit connected to a far end of each of the wordlines, opposite the near end of the wordlines, the feedback circuit comprises:
   an inverter connected to the far end of the wordlines;
   an inner positive polarity transistor gated by output from the inverter and electrically connecting the inverter back to the far end of the wordlines to form a first feedback loop;
   an outer positive polarity transistor gated by the internal clock signal and electrically connecting a relatively lower voltage source to the inner positive polarity transistor;
   an inner negative polarity transistor gated by output from the inverter and electrically connecting the inverter back to the far end of the wordlines to form a second feedback loop; and
   an outer negative polarity transistor gated by the internal clock signal and electrically connecting a relatively higher voltage source to the inner negative polarity transistor.

2. The device according to claim 1, the internal clock signal arrives to the outer positive polarity transistor and the outer negative polarity transistor before the wordline select signal arrives at the far end of the wordlines.

3. The device according to claim 1, the internal clock signal controls the outer positive polarity transistor and the outer negative polarity transistor before the wordline select signal controls the inner positive polarity transistor and the inner negative polarity transistor.

4. The device according to claim 1, the inner positive polarity transistor electrically disconnects the relatively lower voltage source from the first feedback loop when the wordline select signal is present, and
   the inner negative polarity transistor electrically disconnects the relatively higher voltage source from the second feedback loop when the wordline select signal is not present.

5. The device according to claim 1, the first feedback loop lowers the voltage of the far end of the wordlines that do not have the wordline select signal by connecting the far end of the wordlines to the relatively lower voltage source, and
   the second feedback loop raises the voltage of the far end of one of the wordlines that has the wordline select signal by supplying voltage from the relatively higher voltage source.

6. The device according to claim 1, the wordlines comprise uninterrupted conductors from the near end to the far end.

7. The device according to claim 1, the wordlines have a length between the near end and the far end that equals a full length of the rows of the memory cells.

8. A device comprising:
   an array of memory cells arranged in rows and columns that are perpendicular to each other;
   wordlines comprising conductors connected to the memory cells, each of the wordlines is connected to a distinct row of the array of the memory cells;
   bitlines comprising conductors connected to the memory cells, each of the bitlines is connected to a distinct column of the array of the memory cells;

a wordline driver circuit connected to a near end of the wordlines, the wordline driver circuit includes:
   a global controller outputting an internal clock signal; and
   a decoder outputting a wordline select signal in response to the internal clock signal; and
a feedback circuit connected to a far end of each of the wordlines, opposite the near end of the wordlines,
the feedback circuit comprises:
   an inverter connected to the far end of the wordlines;
   an inner positive polarity transistor gated by output from the inverter and electrically connecting the inverter back to the far end of the wordlines to form a first feedback loop;
   an outer positive polarity transistor gated by the internal clock signal and electrically connecting a relatively lower voltage source to the inner positive polarity transistor;
   an inner negative polarity transistor gated by output from the inverter and electrically connecting the inverter back to the far end of the wordlines to form a second feedback loop; and
   an outer negative polarity transistor gated by the internal clock signal and electrically connecting a relatively higher voltage source to the inner negative polarity transistor.

9. The device according to claim 8, the internal clock signal arrives to the outer positive polarity transistor and the outer negative polarity transistor before the wordline select signal arrives at the far end of the wordlines.

10. The device according to claim 8, the internal clock signal controls the outer positive polarity transistor and the outer negative polarity transistor before the wordline select signal controls the inner positive polarity transistor and the inner negative polarity transistor.

11. The device according to claim 8, the inner positive polarity transistor electrically disconnects the relatively lower voltage source from the first feedback loop when the wordline select signal is present, and
   the inner negative polarity transistor electrically disconnects the relatively higher voltage source from the second feedback loop when the wordline select signal is not present.

12. The device according to claim 8, the first feedback loop lowers the voltage of the far end of the wordlines that do not have the wordline select signal by connecting the far end of the wordlines to the relatively lower voltage source, and
   the second feedback loop raises the voltage of the far end of one of the wordlines that has the wordline select signal by supplying voltage from the relatively higher voltage source.

13. The device according to claim 8, the wordlines comprise uninterrupted conductors from the near end to the far end.

* * * * *